United States Patent
Liu et al.

(10) Patent No.: US 9,970,101 B2
(45) Date of Patent: May 15, 2018

(54) METAL-FREE CVD COATING OF GRAPHENE ON GLASS AND OTHER DIELECTRIC SUBSTRATES

(71) Applicant: Corning Incorporated, Corning, NY (US)

(72) Inventors: Xinyuan Liu, Painted Post, NY (US); Robert George Manley, Vestal, NY (US); Robert Michael Morena, Lindley, NY (US); Zhen Song, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days. days.

(21) Appl. No.: 15/332,562

(22) Filed: Oct. 24, 2016

(65) Prior Publication Data
US 2017/0037510 A1 Feb. 9, 2017

Related U.S. Application Data

(62) Division of application No. 14/182,819, filed on Feb. 18, 2014, now Pat. No. 9,505,624.

(51) Int. Cl.
*H01L 29/16* (2006.01)
*C01B 31/04* (2006.01)
(Continued)

(52) U.S. Cl.
CPC ............ *C23C 16/26* (2013.01); *C01B 32/182* (2017.08); *C01B 32/186* (2017.08); *C03C 17/22* (2013.01); *C04B 41/85* (2013.01); *C23C 16/0227* (2013.01); *C23C 16/44* (2013.01); *C03C 2217/28* (2013.01); *C03C 2218/152* (2013.01); *Y10T 428/24975* (2015.01);
(Continued)

(58) Field of Classification Search
CPC ......... C01B 31/00; C01B 31/04; H01L 29/12; H01L 29/16; H01L 29/45; H01L 29/66; H01L 29/122; H01L 29/1602
USPC .................... 257/40, 77, 419, 642, 643, 759
See application file for complete search history.

(56) References Cited

U.S. PATENT DOCUMENTS 7,611,579 B2 11/2009 Lashmore et al.
8,153,240 B2 4/2012 Wang et al.
(Continued)

FOREIGN PATENT DOCUMENTS

CN 102847933 A 1/2013
CN 102957994 A 1/2013
(Continued)

OTHER PUBLICATIONS

Fanton et al; "Characterization of Graphene Films and Transistors Grown on Sapphire by Metal-Free Chemical Vapor Deposition", ACSNano, 2011, vol. 5, No. 10, pp. 8062-8069.
(Continued)

*Primary Examiner* — Chuong A Luu
(74) *Attorney, Agent, or Firm* — Dinsmore & Shohl LLP (57) ABSTRACT

A catalyst-free CVD method for forming graphene. The method involves placing a substrate within a reaction chamber, heating the substrate to a temperature between 600° C. and 1100° C., and introducing a carbon precursor into the chamber to form a graphene layer on a surface of the substrate. The method does not use plasma or a metal catalyst to form the graphene.

19 Claims, 10 Drawing Sheets

(51) Int. Cl.
*C23C 16/26* (2006.01)
*C03C 17/22* (2006.01)
*C04B 41/85* (2006.01)
*C23C 16/02* (2006.01)
*C23C 16/44* (2006.01)
*C01B 32/182* (2017.01)
*C01B 32/186* (2017.01)

(52) U.S. Cl.
CPC .......... *Y10T 428/25* (2015.01); *Y10T 428/265* (2015.01); *Y10T 428/30* (2015.01)

(56) References Cited

U.S. PATENT DOCUMENTS

| | | |
|---|---|---|
| 8,182,782 B1 | 5/2012 | Moravsky et al. |
| 8,246,927 B2 | 8/2012 | Inoue et al. |
| 8,404,209 B2 | 3/2013 | Moravsky et al. |
| 2004/0266619 A1 | 12/2004 | Bernas et al. |
| 2009/0278556 A1 | 11/2009 | Man et al. |
| 2011/0030772 A1 | 2/2011 | Veerasamy |
| 2011/0163296 A1 | 7/2011 | Pace et al. |
| 2011/0303899 A1 | 12/2011 | Padhi et al. |
| 2012/0282489 A1 | 11/2012 | Shin et al. |
| 2012/0313591 A1 | 12/2012 | Brambilla et al. |
| 2013/0026978 A1 | 1/2013 | Cooley et al. |
| 2013/0029215 A1 | 1/2013 | Signorelli et al. |
| 2013/0037756 A1 | 2/2013 | Kim et al. |
| 2013/0044405 A1 | 2/2013 | Brambilla et al. |
| 2013/0045157 A1 | 2/2013 | Brambilla et al. |
| 2013/0064863 A1 | 3/2013 | Biris et al. |
| 2013/0130011 A1 | 5/2013 | Hong et al. |
| 2013/0143048 A1 | 6/2013 | Kim et al. |
| 2013/0143108 A1 | 6/2013 | Epstein |
| 2013/0202813 A1 | 8/2013 | Chueh et al. |
| 2013/0243969 A1* | 9/2013 | Teng ............. B82Y 40/00 427/539 |
| 2013/0273260 A1* | 10/2013 | Chueh ............ C01B 31/0446 427/555 |
| 2014/0042988 A1 | 2/2014 | Kuttipillai |
| 2015/0110998 A1* | 4/2015 | Borrelli ............ C03C 17/22 428/116 |

FOREIGN PATENT DOCUMENTS

| | | |
|---|---|---|
| KR | 2011136340 A | 12/2011 |
| KR | 1012204210000 | 12/2011 |
| KR | 101208770 B1 | 12/2012 |
| KR | 20130049048 a | 5/2013 |
| WO | 2014004514 A1 | 1/2014 |

OTHER PUBLICATIONS

Hwang et al; "Epitaxial growth of graphitic carbon on C-face SiC and sapphire by chemical vapor deposition (CVD)", J. Crystal Growth, 2012, 312(21), pp. 3219-3224.

International Search Report of the International Searching Authority; PCT/US2015/015792; dated Apr. 30, 2015; 5 Pages; European Patent Office.

Medina et al; "Metal-Free Growth of Nanographene on Silicon Oxides for Transparent Conducting Applications", Advanced Functional Materials 2012, 22, pp. 2123-2128.

Miyasaka et al; "Graphene Thin Films Consisting of Nanograins of Multilayer Graphene on Sapphire Substrates Directly Grown by Alcohol Chemical Vapor Deposition", Japanese Journal of Applied Physics, 50 (2011), pp. 04DHI 2-I-04DHI2-4.

Son et al; "Direct Growth of Graphene Pad on Exfoliated Hexagonal Boron Nitride Surface", Nanoscale, 20 11, 3, pp. 3089-3093.

Song et al, "Large scale metal-free synthesis of graphene on sapphire and transfer-free device fabrication", Nanoscale, 2012, 4(1 0), pp. 3050-3054.

Xue et al; "Scanning tunnelling microscopy and spectroscopy of ultra-flat graphene on hexagonal boron nitride", Nature Materials, 2011, 10, pp. 282-285.

Yang et al; "Direct PECVD growth of vertically erected graphene walls on dielectric substrates as excellent multifunctional electrodes", J. Materials Chemistry A. 2013, I 13), pp. 770-775.

\* cited by examiner

METAL-FREE CVD COATING OF GRAPHENE ON GLASS AND OTHER DIELECTRIC SUBSTRATES

This is a divisional application of U.S. application Ser. No. 14/182,819 filed on Feb. 18, 2014, now U.S. Pat. No. 9,505,624 the content of which is relied upon and incorporated herein by reference in its entirety, and the benefit of priority under 35 U.S.C. § 120 is hereby claimed.

BACKGROUND

Field

The present disclosure relates generally methods for forming graphene thin films, and more specifically to a CVD route for directly forming graphene layers directly on dielectric substrates.

Technical Background

Figure 1:
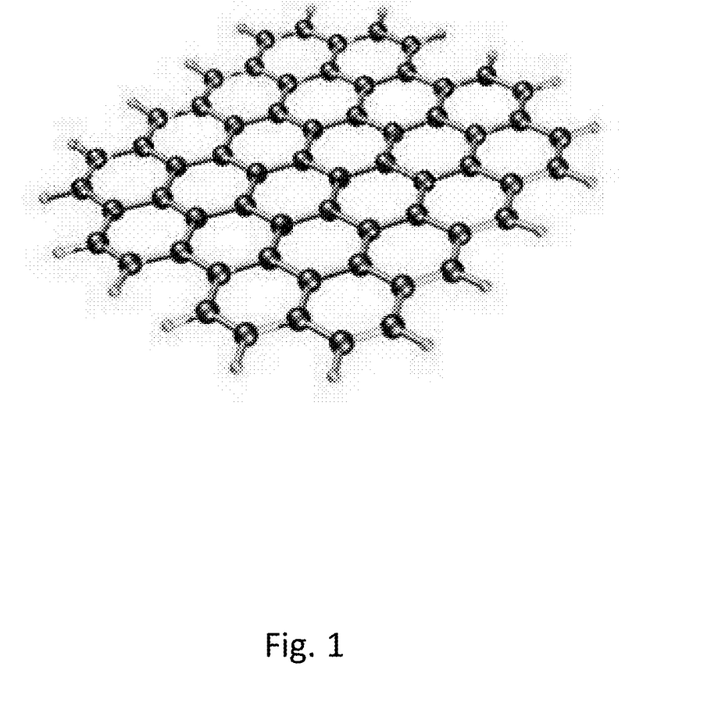
FIG. 1 is a schematic diagram of graphene according to one embodiment.

Graphene is a two-dimensional allotrope of carbon. The structure of graphene includes a single planar sheet of $sp^2$-hybridized carbon atoms arranged in a densely-packed honeycomb array. The carbon-carbon bond length in graphene is about 0.142 nm. A schematic of a graphene monolayer is shown in FIG. 1.

In essence, graphene is an isolated atomic plane of graphite. As a 2-dimensional crystalline material, graphene has unique properties including high intrinsic mobility (200,000 $cm^2V^{-1}s^{-1}$), Young's modulus (~1,100 GPa), breaking strength (42 $Nm^{-1}$), fracture strength (~125 GPa), thermal conductivity (~5000 $Wm^{-1}K^{-1}$), surface area (2,630 $m^2g^{-1}$), and an optical transmittance of ~97%. With such remarkable properties, graphene has a wide variety of potential applications that range from nano-electromechanical resonators and high-performance field effect transistors to clean energy devices, sensors and antibacterial products.

Graphene was first isolated via mechanical exfoliation of highly-oriented pyrolytic graphite (HOPG). It is now well-known that tiny fragments of graphene sheets are produced whenever graphite is abraded, such as when drawing with a pencil. Graphene can also be obtained via carbon segregation by heating a carbon source such as silicon carbide to high temperature (>1100° C.) at low pressure (~$10^{-6}$ Torr) to reduce it to graphene.

The lack of a large-scale synthesis route for the production of high-quality graphene at low cost has substantially hampered its proliferation. Accordingly, it would be advantageous to develop an economical method for forming large area graphene.

BRIEF SUMMARY

In accordance with embodiments of the present disclosure, a method for forming graphene comprises placing a substrate within a reaction chamber, heating the substrate to a temperature between 600° C. and 1100° C., introducing a carbon precursor into the chamber and forming a graphene layer on a surface of the substrate, wherein the substrate is free of a metal catalyst and the chamber is free of plasma during the forming.

A graphene-coated substrate comprises a dielectric substrate such as a glass, ceramic or glass-ceramic substrate, and a graphene layer formed in direct contact with a surface of the dielectric substrate.

Additional features and advantages of the subject matter of the present disclosure will be set forth in the detailed description which follows, and in part will be readily apparent to those skilled in the art from that description or recognized by practicing the subject matter of the present disclosure as described herein, including the detailed description which follows, the claims, as well as the appended drawings.

It is to be understood that both the foregoing general description and the following detailed description present embodiments of the subject matter of the present disclosure, and are intended to provide an overview or framework for understanding the nature and character of the subject matter of the present disclosure as it is claimed. The accompanying drawings are included to provide a further understanding of the subject matter of the present disclosure, and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative, and are not intended to limit the scope of the claims in any manner.

BRIEF DESCRIPTION OF THE DRAWINGS

The following detailed description of specific embodiments of the present disclosure can be best understood when read in conjunction with the following drawings, where like structure is indicated with like reference numerals and in which.

DETAILED DESCRIPTION

Reference will now be made in greater detail to various embodiments of the subject matter of the present disclosure, some embodiments of which are illustrated in the accompanying drawings. The same reference numerals will be used throughout the drawings to refer to the same or similar parts.

Direct CVD growth of graphene on dielectric substrates is disclosed. The method is performed without plasma or a metal catalyst. According to embodiments, a graphene-coated substrate comprises a graphene layer formed in direct contact with a surface of a dielectric substrate. The substrate can comprise glass, ceramic or glass-ceramic.

In contrast to conventional layer transfer methods, the instant CVD approach involves fewer processing steps, which minimizes the potential for contamination of or damage to the graphene layer or graphene-substrate interface. For example, the graphene-substrate interface can be free of molecular adsorbates such as water and hydroxyl groups. In embodiments, the concentration of such molecular adsorbates at the graphene-substrate interface is less than 0.5 at. %. The present CVD method may be used to form well-adhered graphene layers on planar and non-planar substrates including substrates have concave or convex features such as porous substrates and honeycomb substrates.

Graphene is essentially a one-atom thick layer of graphite. In the graphene structure, carbon atoms are covalently bonded to each other. As illustrated in FIG. 1, the plurality of carbon atoms may form six-membered rings as the typical repeating unit. Graphene may further comprise 5-membered and/or 7-membered rings. Thus, graphene manifests as a single layer or plural layers of covalently bonded ($sp^2$ hybridized) carbon atoms. The graphene layer thickness may range from about 0.34 nm (monolayer) to 100 nm (plural layers). In embodiments, a graphene layer may include up to 100 atomic layers of carbon. Thus, in addition to monolayer, bi-layer and tri-layer graphene, a graphene layer may comprise N atomic layers of carbon where $4 \leq N \leq 100$.

Graphene layer(s) are formed via thermal decomposition of a carbon precursor. Example carbon precursors include acetylene, ethylene and methane. Acetylene, which has a comparatively low dissociation temperature, was used in several experiments to deposit graphene on non-metal-catalyzed substrates without the use of plasma. In embodiments, the substrate is free of a metal catalyst such as copper or nickel, which are used conventionally to induce graphene formation. In embodiments, no metal catalyst is in physical contact with the substrate during graphene deposition on the substrate.

In an example process, a substrate is placed within a reaction chamber and acetylene (or another carbon precursor) is introduced into the chamber at a specified chamber pressure while the substrate is heated to a specified substrate temperature. The chamber pressure may range from 0.001 Torr to 760 Torr (e.g., 0.001, 0.002, 0.005, 0.01, 0.02, 0.05, 0.1, 0.2, 0.5, 1, 2, 5, 10, 20, 50, 100, 200, 500 or 760 Torr, including ranges between any of the foregoing values), and the substrate temperature during the deposition may range from 600° C. to 1100° C. (e.g., 600, 700, 800, 900, 100 or 1100° C., including ranges between any of the foregoing values). Substrates may include dielectric substrates such as glass, ceramic and glass-ceramic materials. Using the disclosed CVD process enables direct deposition of graphene on many different glass substrates. Example substrates include Eagle XG® glass, Corning Willow™ glass, and Corning Lotus™ glass. In contrast to PECVD, which is restricted to near line-of-sight layer growth due to shadowing and plasma penetration limitations, thermal CVD can be used to form graphene layer(s) within the pores or channels of a substrate.

The graphene layers may be characterized by an average thickness ranging from 5 to 50 nm and an average grain size ranging from 10 to 100 nm, e.g., 15 to 40 nm or 20 to 30 nm. Optionally, the average grain size of the CVD deposited graphene layers can be increased using a post-deposition heat treatment such as a vacuum heat treatment. A post-deposition heat treatment can increase one or both of the conductivity and transparency of the graphene.

EXAMPLES

Example 1. Graphene Layers Formed on Silica Glass

Fused $SiO_2$ glass substrates were cut into coupons measuring 1 in×0.75 in. The individual coupons were cleaned by first immersing for 3 min in 5N $NH_4OH$, and then rinsing alternately with 18 MΩ water and methanol. After rinsing, the silica pieces were inserted into a 1 in diameter tube furnace. The reaction chamber was evacuated using a mechanical pump to a base pressure of $5 \times 10^{-2}$ Torr. The substrate temperature was increased to the deposition temperature and acetylene gas was introduced to the reaction chamber at a prescribed pressure.

Figure 2:
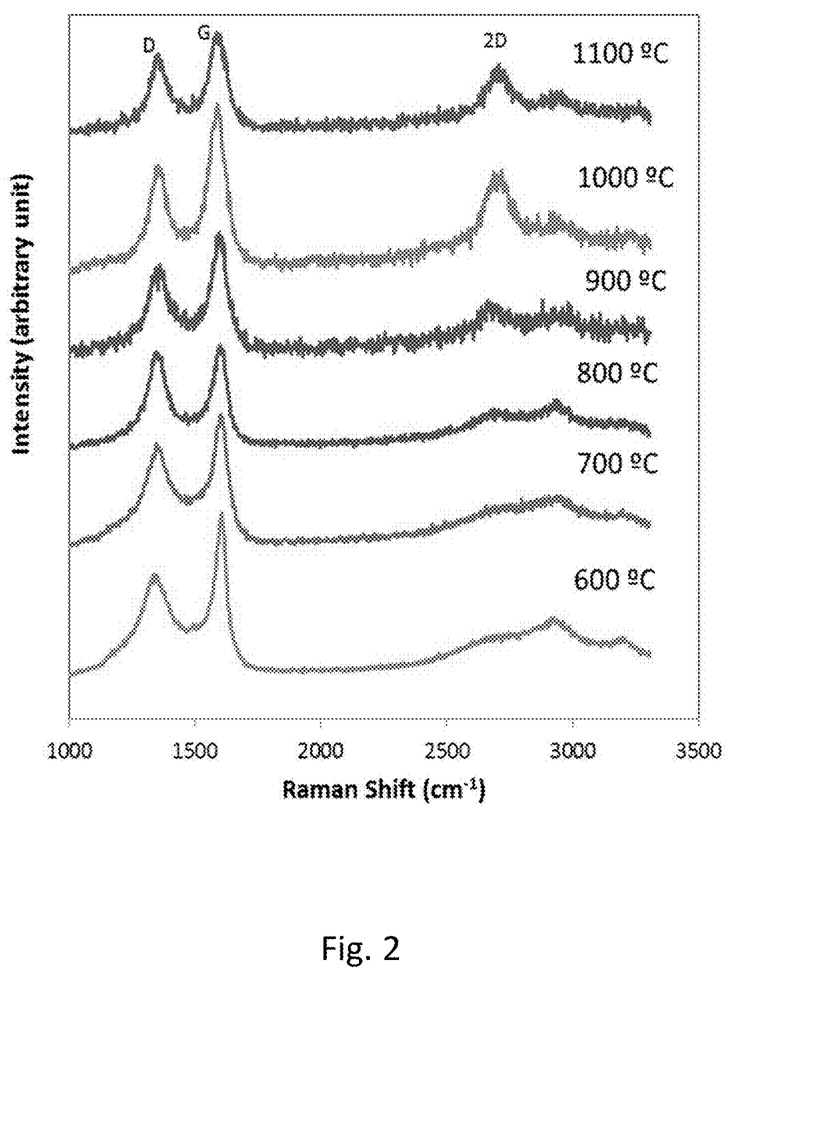
FIG. 2 shows Raman spectra of graphene layers formed on silica substrates.

Raman spectroscopy was used to characterize the resulting graphene layers. Raman spectra of graphene layers formed on silica ($SiO_2$) substrates at substrate temperatures ranging from 600° C. to 1100° C. are shown in FIG. 2. The respective D, G and 2D graphene peaks are indicated.

The G band (~1580 $cm^{-1}$) and 2D band (~2700 $cm^{-1}$) are characteristic features of graphene. The G band is due to in-plane resonance from graphitic $sp^2$ bonding. Without wishing to be bound by theory, the intensity of the G band peak is proportional to the amount of graphitic structure within the graphene. The 2D band originates from a two phonon double resonance Raman process, and is closely related to the band structure of graphene layers. The D band provides an indication of the amount of defects within the graphene layer(s).

Figure 3:
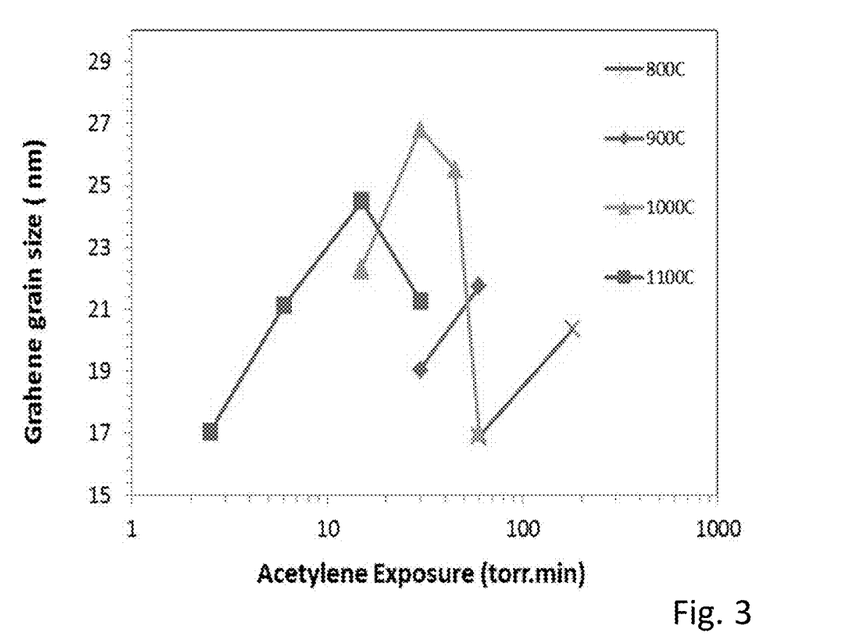
FIG. 3 is a plot of graphene grain size versus acetylene exposure time.

From the intensity ratio of the D/G bands, the size of the graphene grains can be determined from the equation d=) $(2.4 \times 10^{-10}) \lambda^4 / (I_D / I_G)$, where $\lambda = 514$ nm. A plot of grain size versus acetylene exposure time for various growth temperatures is shown in FIG. 3. In FIG. 3, the graphene grain size ranges from about 17 nm to about 27 nm, which corresponds to respective D/G ratios of 0.99 and 0.62. The D/G ratio may range from 0.6 to 1.5 (e.g., 0.6, 0.7, 0.8, 0.9, 1.0, 1.1, 1.2, 1.3, 1.4 or 1.5, including ranges between any of the foregoing values).

The intensity of the 2D band is inversely proportional to the thickness of the graphitic layers. Monolayer graphene is characterized by a G/2D ratio of less than 1. Bi-layer graphene is characterized by a G/2D ratio of unity. Multi-layer graphene is characterized by a G/2D ratio greater than 2.

Figure 4:
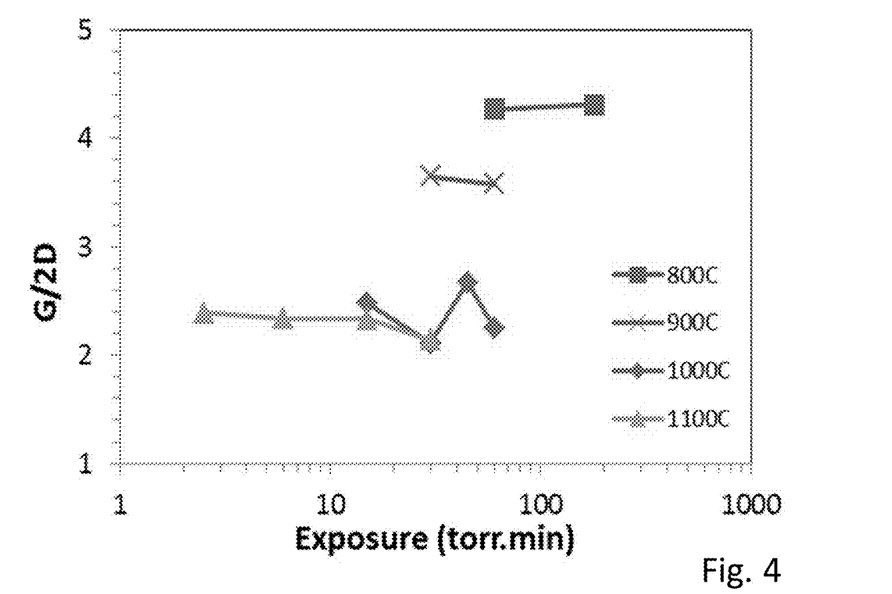
FIG. 4 is a plot of Raman G/2D intensity ratios versus total acetylene exposure.

FIG. 4 is a plot of Raman intensity ratio (G/2D) versus acetylene exposure (pressure×time) for various growth temperatures. Generally, the higher the deposition (substrate) temperature, the flatter the graphene grains. In FIG. 4, the minimum G/2D intensity ratio is 2.1, indicating that the graphene contains only a few layers of carbon.

Figure 5:
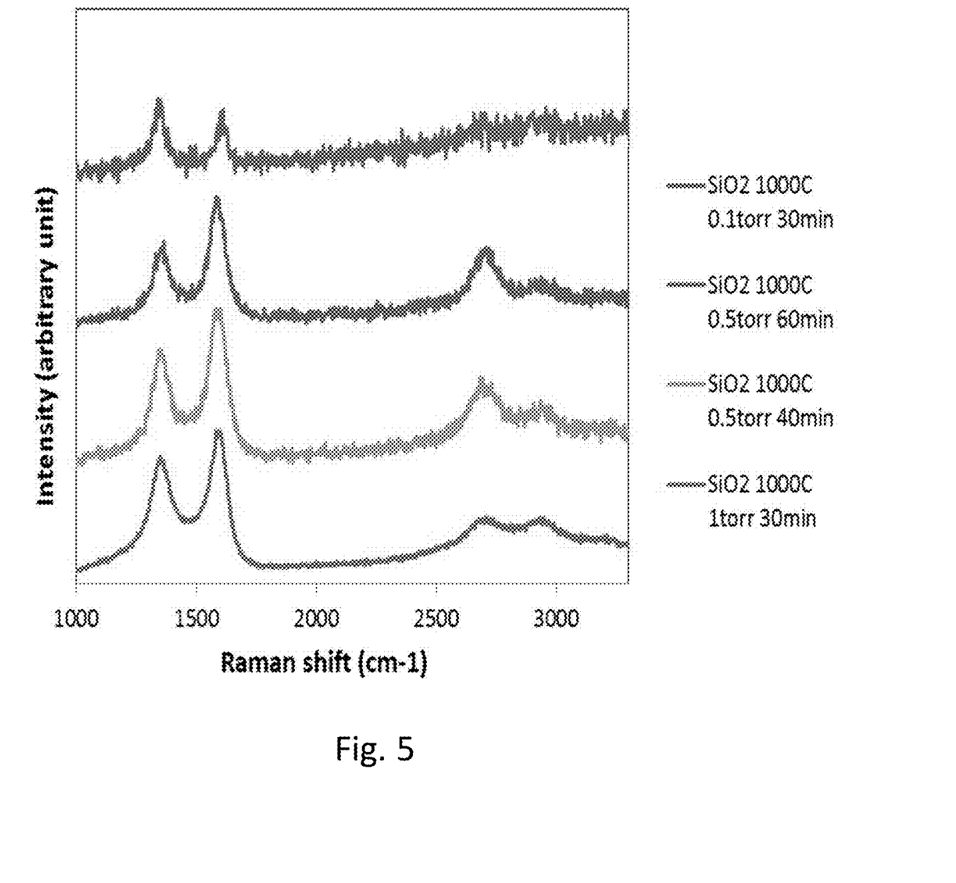
FIG. 5 shows Raman spectra for graphene layers formed on silica ($SiO_2$) substrates at 1000° C. under different conditions of pressure and growth time.

Shown in FIG. 5 are Raman spectra for graphene layers formed on silica ($SiO_2$) substrates at 1000° C. for reaction chamber pressures ranging from 0.1 to 1 Torr and growth times ranging from 30 to 60 min. The D band intensity decreases and the 2D band intensity increases with increased deposition time, consistent with larger and flatter grains. As a function of deposition pressure, the 2D band intensity exhibits a maximum at intermediate pressures (~0.5 Torr) and decreases at both lower (0.1 Torr) and higher (1 Torr) pressure.

Figure 6A:
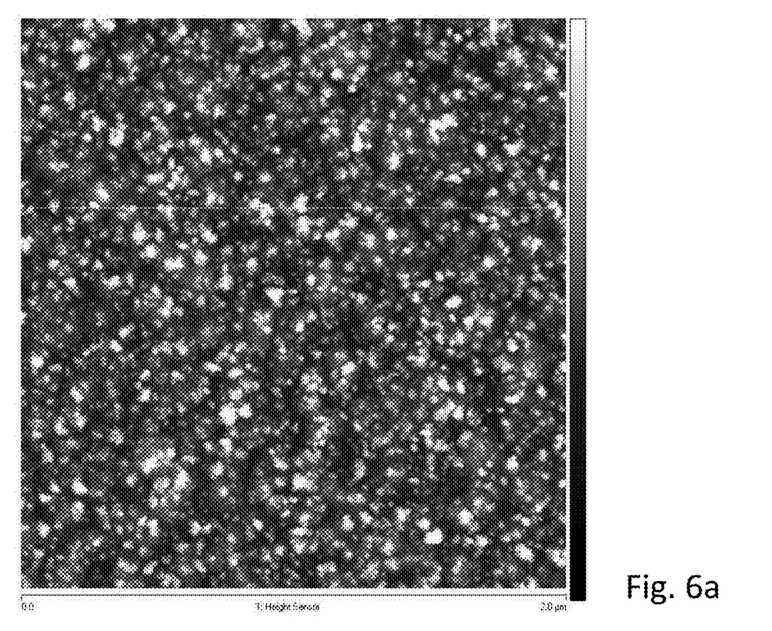
FIGS. 6a and 6b are atomic force microscope (AFM) images of a graphene layer.
Figure 6B:
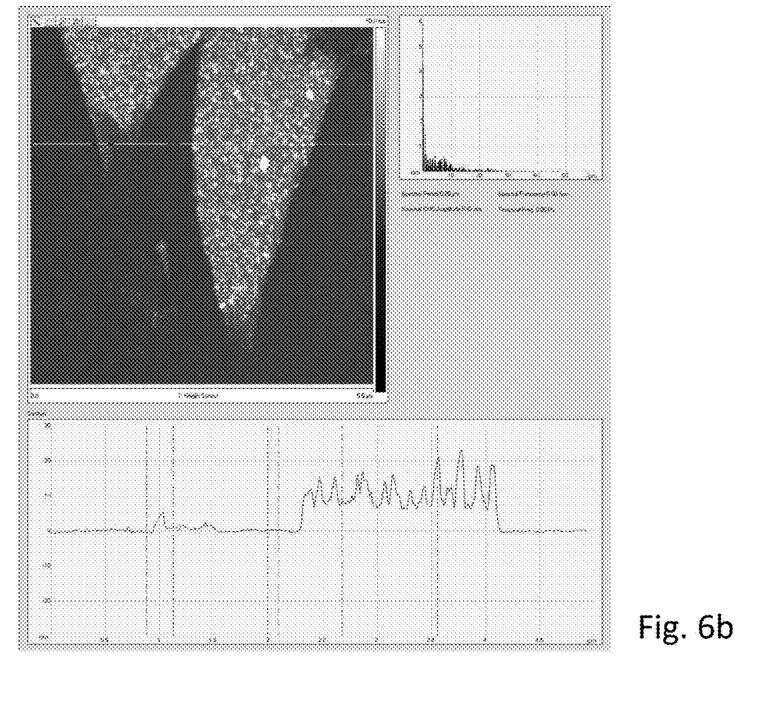

FIG. 6a is an atomic force microscope (AFM) image of a graphene layer on a silica substrate. FIG. 6b is an AFM image of the graphene layer partially delaminated from the substrate using Scotch tape. A height profile is also shown in FIG. 6b. The graphene layer was formed at a substrate temperature of 1000° C. The data shown in FIGS. 6a and 6b correspond to the second trace from FIG. 5 (0.5 Torr acetylene; 60 min.). The graphene layer thickness is 10-20 nm.

Example 2. Graphene Layers Formed on Different Glass Substrates

A high temperature glass containing $SiO_2$, $Al_2O_3$, MgO and CaO (ARV glass) with the composition shown in the Table 1 was ground into glass frit, and pressed into pellets. The pellets were sintered at 1000° C. for 2 hours and used as substrates for direct graphene growth. A comparison of the graphene layers formed on the ARV glass was made to graphene grown at the same condition on $SiO_2$ glass, a comparative Ni-coated $SiO_2$ glass, and a comparative Ni-containing glass (AXZ glass) substrate.

TABLE 1

ARV and AXZ glass substrate compositions (mole %)

| | ARV | AXZ |
| --- | --- | --- |
| SiO2 | 51.9% | 49.1% |
| Al2O3 | 22.8% | 21.6% |
| MgO | 18.2% | 17.2% |
| CaO | 7.1% | 6.8% |
| NiO | | 4.7% |

Figure 7:
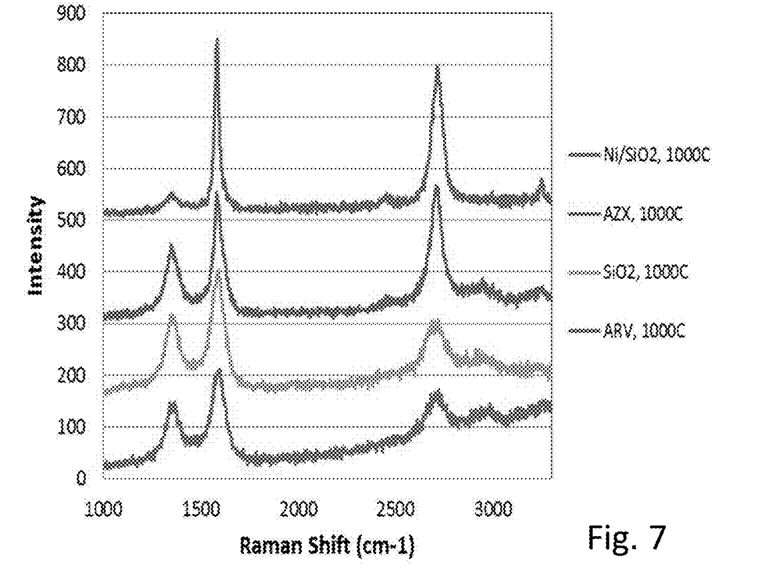
FIG. 7 shows Raman spectra for graphene formed on different glass substrates.

Raman spectra of comparative graphene layers formed on catalyzed substrates and inventive graphene layers formed on non-catalyzed substrates at 1000° C. in 0.5 Torr acetylene for 1 h are shown in FIG. 7. The substrates include (a) nickel coated silica glass, (b) nickel-containing glass (AZX), (c) silica glass, and (d) nickel-free glass (ARV). Graphene layers formed on the nickel-coated silica glass and the nickel-containing glass are comparative. The presence of Ni, either as a thin layer on the deposition surface or incorporated into the glass composition, enhances the graphene grain size (lower intensity D band) and flattens the grain shape (higher intensity 2D band). The quality of the graphene layers formed on ARV glass was similar to that of the graphene formed on $SiO_2$ glass.

Figure 8:
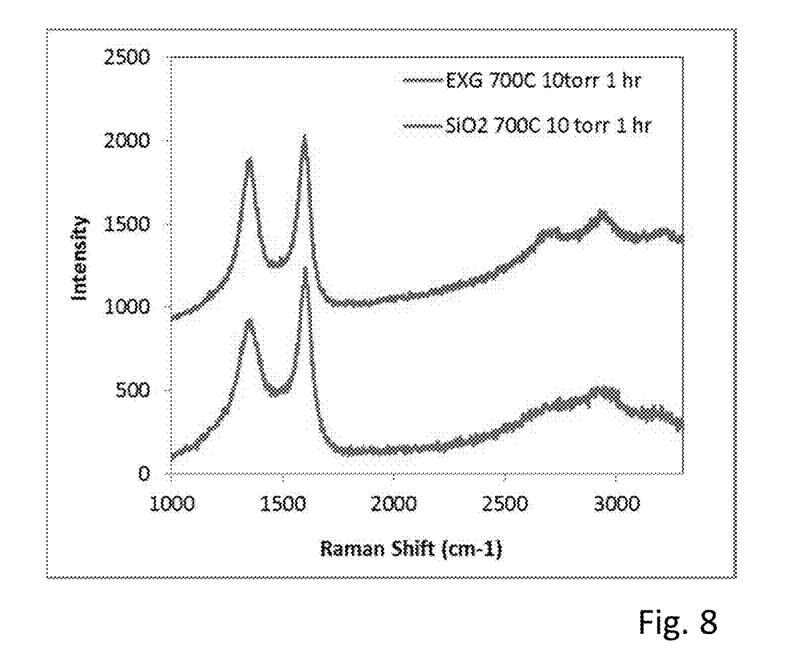
FIG. 8 shows Raman spectra for graphene formed on Eagle XG® glass and silica glass.

FIG. 8 shows similar Raman spectra for graphene layers deposited via CVD at 700° C. in 10 Torr acetylene for 1 hr onto a Corning Eagle XG® glass substrate and onto a silica glass substrate.

Example 3. Electrical and Optical Properties of Graphene

Figure 9:
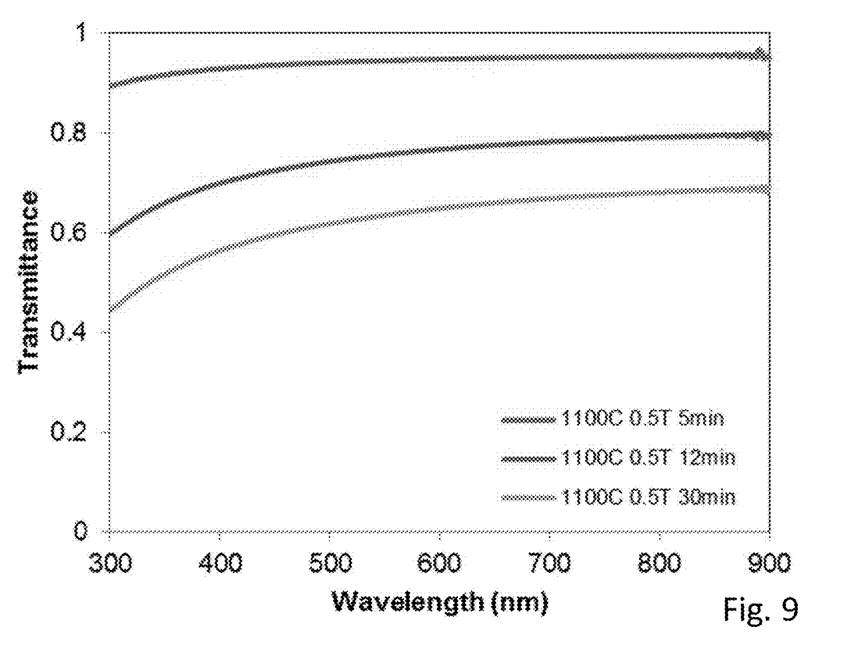
FIG. 9 is a plot of transmittance versus wavelength for graphene layers according to embodiments.
Figure 10:
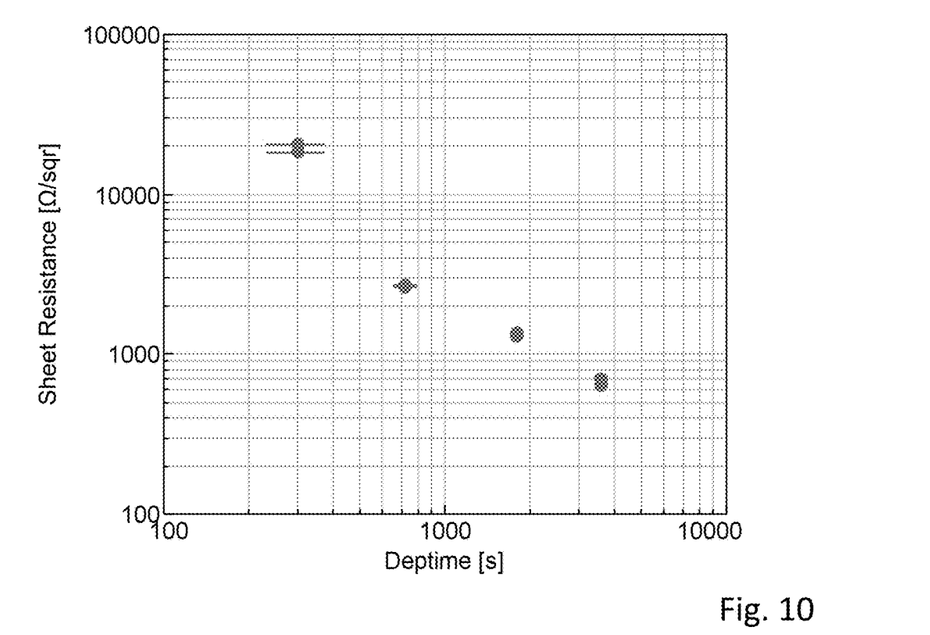
FIG. 10 is a plot of Van der Pauw sheet resistance for different graphene layers.
Figure 11:
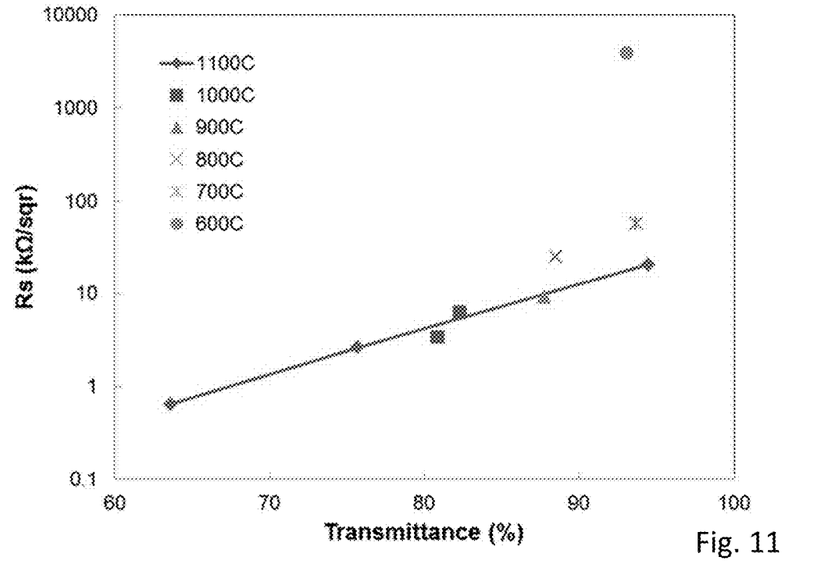
FIG. 11 is a plot of graphene sheet resistance versus transmittance at 550 nm.
Figure 12:
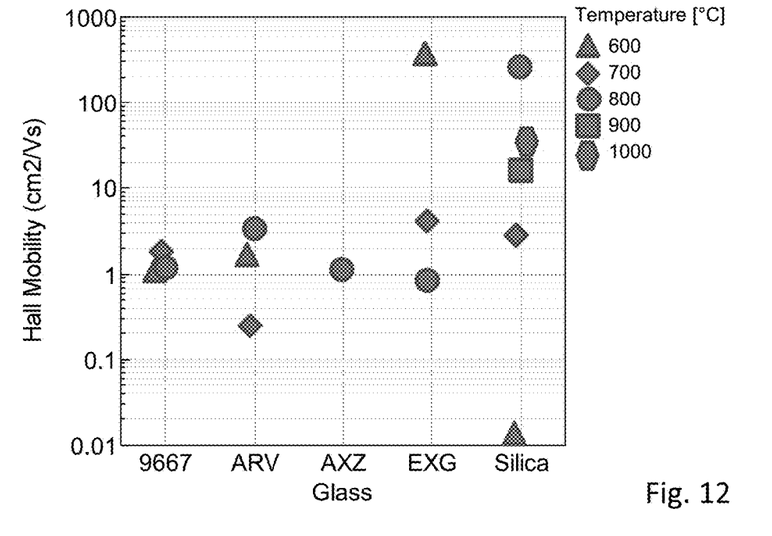
FIG. 12 is a plot of Hall mobility for graphene layers on various glass substrates.

Transmittance spectra for graphene layers formed via acetylene CVD on silica ($SiO_2$) substrates at 1100° C. using a reaction chamber pressure of 0.5 Torr for growth times of 5, 12 and 30 min are shown in FIG. 9. At 550 nm, as the growth time and therefore the layer thickness increases, the transmittance decreases from 94.46% to 75.69% to 63.58%, respectively. Van der Pauw sheet resistance data are plotted in FIG. 10 for graphene layers formed via acetylene CVD at 1100° C. using a reaction chamber pressure of 0.5 Torr for various growth times. FIG. 11 is a plot of sheet resistance versus transmittance at 550 nm. This data indicate that the graphene layers deposited at 900-1100° C. are similar in quality, while layers formed at lower temperatures have a lower quality. FIG. 12 is a plot of Hall mobility data for graphene layers on various glass substrates. The Hall mobility ranges from 1 to 300 $cm^2$Ns. Higher mobility is associated with a higher deposition temperature.

Example 4. Post-Deposition Graphene Refinement

Several post-deposition approaches were explored with the goal of improving the quality of the as-deposited layers. In embodiments, a post-CVD vacuum heat treatment was used. The heat treatment was conducted within the reaction chamber after stopping the flow of carbon precursor.

The heat treatment temperature may range from 900° C. to 1200° C., e.g., 900, 1000, 1100 or 1200° C. for 0.25, 0.5 or 1 hr. As an example, a graphene on silica glass sample, which was deposited at 1000° C. in 0.5 Torr acetylene for 30 min, was heated at 1000° C. in vacuum ($5 \times 10^{-6}$ torr) for 1 hr. The Raman-measured graphene grain size increased nearly 12%, from 22.5 nm to 25.1 nm.

In embodiments, the as-deposited graphene can be covered with a metal foil or a metal-coated substrate such that the metal is in contact with the graphene during the post-deposition heat treatment. Example metals include nickel or copper.

A graphene layer was formed on a silica substrate at 1000° C. in 0.5 Torr acetylene for 90 min. After the deposition, the graphene was heated at 1000° C. in vacuum ($5 \times 10^{-6}$ torr) for 1 hr during which time the graphene surface was cover by a Ni-coated (200 nm) $SiO_2$ glass, a Ni foil or a nickel-containing glass. The post-deposition heat treatment using the nickel-coated glass in contact with the graphene increased the graphene grain size from 25.52 nm to 26.88 nm (5.3%) and the post-deposition heat treatment using nickel foil in contact with the graphene increased the graphene grain size from 25.52 nm to 26.73 nm (4.7%).

Example 5. Remote Graphene Catalysis

In embodiments, a metal foil, metal-coated substrate or metal-containing substrate can be placed proximate to the dielectric substrate such that the metal is not in physical contact with the graphene or the dielectric substrate during graphene growth. By proximate is meant that the metal foil, metal-coated substrate or metal-containing substrate is at a distance of less than 5 mm (e.g., about 0.5, 1, 2 or 5 mm) from the dielectric substrate.

A graphene layer was formed on a silica substrate at 900° C. in 0.5 Torr acetylene for 90 min. During the graphene growth, a nickel-containing glass (AXZ glass) was placed proximate to the silica substrate. The graphene grain size on a silica substrate without the remote catalyst was 21.75 nm, while the graphene grain size using the remote nickel-containing glass was 35.12 nm.

Example 6. CVD-Derived Graphene on Cordierite Honeycomb Substrates

Figure 13:
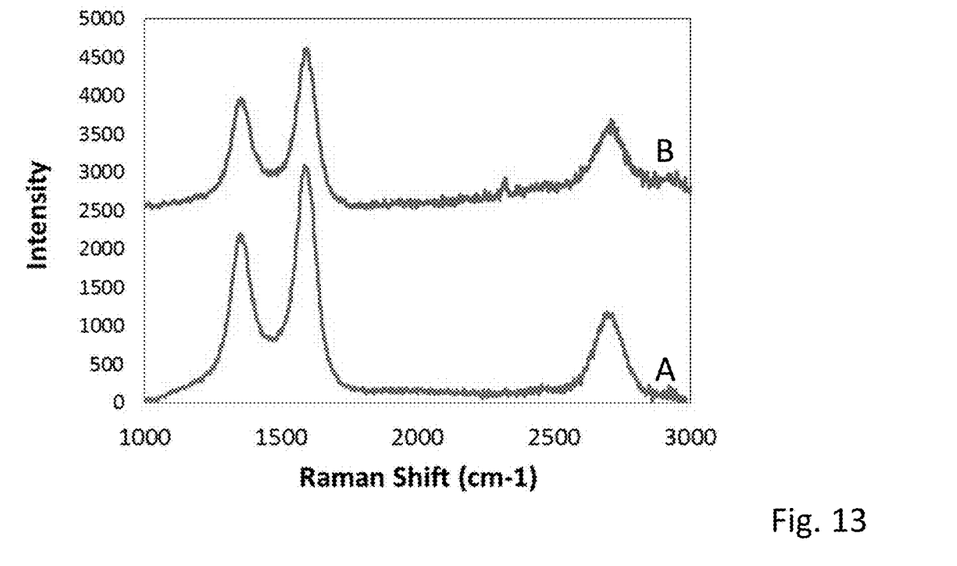
FIG. 13 shows Raman spectra for graphene formed on a cordierite honeycomb substrate.

Graphene was formed on a cordierite honeycomb substrate (cell density 400 cpsi, wall thickness 4 mil). Example deposition conditions were 1000° C. in 0.5 Torr $C_2H_2$ for 1 hr. Graphene was formed throughout the honeycomb channels and within the pores of the channel walls, which was evidenced by the uniform color change of the honeycomb substrate from pale yellow to black. Following graphene deposition, the entire honeycomb substrate is conductive. The measured conductivity is equal to the conductivity of a graphene layer on a planar glass substrate, which is consistent with the formation of a continuous thin film. Raman spectra taken from the exposed channel wall surface (A) and from a fracture surface within a channel wall (B) are shown in FIG. 13. No significant difference in the spectra were observed for the two locations.

Figure 14:
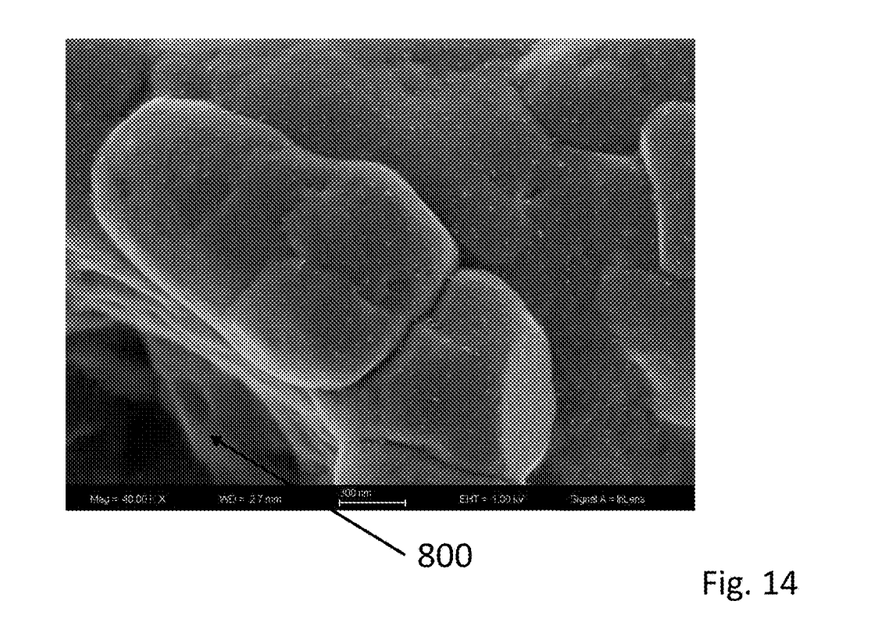
FIG. 14 is an SEM micrograph of a graphene-coated cordierite crystallites according to embodiments.
Figure 15:
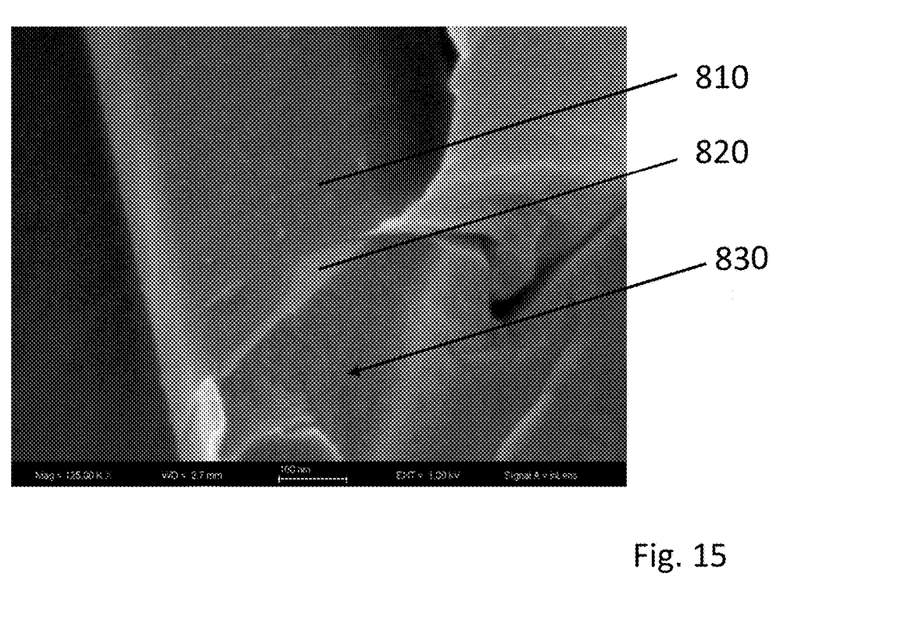
FIG. 15 is an SEM micrograph of a graphene layer formed on cordierite according to embodiments.
Figure 16:
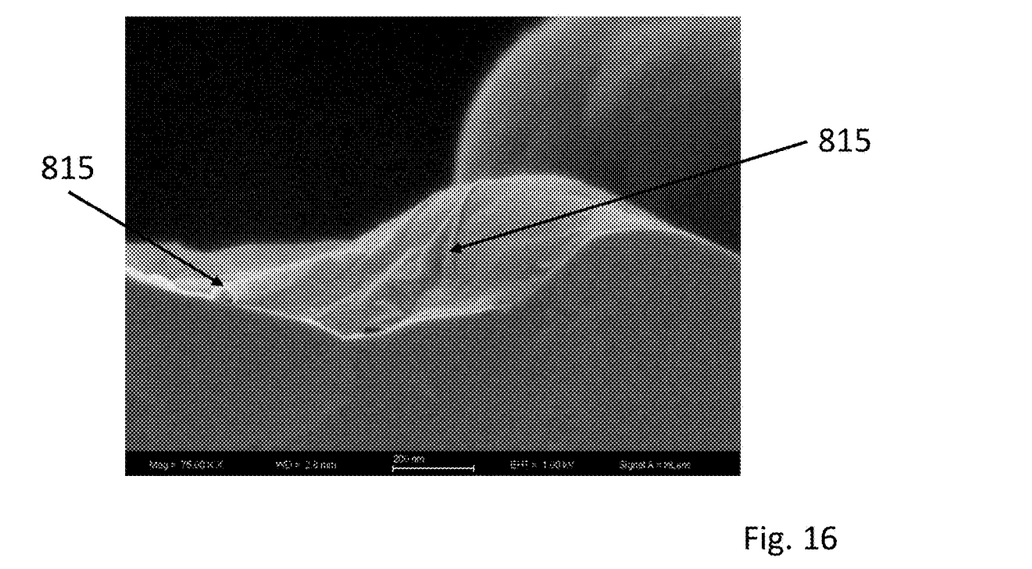
FIG. 16 is an SEM micrograph of wrinkles formed in a graphene layer according to embodiments.

FIG. 14 is an SEM micrograph of graphene-coated cordierite. A pore 800 in the cordierite structure is evident. In the fractured sample of FIG. 15, adjacent to fracture surface 830, the graphene layer 810 and the cordierite surface 820 are visible. Wrinkles 815 in the graphene layer 810 are shown in FIG. 16. In embodiments, the graphene coats the channels and pores of the honeycomb such that both the channels and the pores of honeycomb remain open.

Graphene-coated dielectric substrates, including graphene-coated honeycomb substrates, can be used in a variety of applications, including as electrical and thermal conductive substrates, hydrogen storage, ultracapacitor electrodes, electrical catalyst supports, etc.

As used herein, the singular forms "a," "an" and "the" include plural referents unless the context clearly dictates otherwise. Thus, for example, reference to a "carbon precursor" includes examples having two or more such "carbon precursors" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It is also noted that recitations herein refer to a component being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a substrate comprising glass, ceramic or glass-ceramic include embodiments where a substrate consists of glass, ceramic or glass-ceramic and embodiments where a substrate consists essentially of glass, ceramic or glass-ceramic.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

We claim:

1. A graphene-coated substrate, comprising:
a dielectric substrate; and
a graphene layer formed in direct contact with a surface of the substrate, thereby forming a graphene substrate interface, wherein:
the substrate comprises a glass, ceramic or glass-ceramic; and
the total concentration of water and hydroxyl groups at the graphene-substrate interface is less than 0.5 at. %.

2. The graphene-coated substrate according to claim 1, wherein the substrate surface is free of a metal catalyst.

3. The graphene-coated substrate according to claim 1, wherein the graphene layer is free of a metal catalyst.

4. The graphene-coated substrate according to claim 1, wherein the graphene layer thickness is from 0.34 to 100 nm.

5. The graphene-coated substrate according to claim 1, wherein the graphene layer comprises a bi-layer graphene layer having two atomic layers of carbon.

6. The graphene-coated substrate according to claim 1, wherein the graphene layer comprises a tri-layer graphene layer having three atomic layers of carbon.

7. The graphene-coated substrate according to claim 1, wherein the graphene layer comprises N atomic layers of carbon, where $4 \leq N \leq 100$.

8. The graphene-coated substrate according to claim 1, wherein the graphene layer grain size is from 10 to 100 nm.

9. The graphene-coated substrate according to claim 1, wherein the dielectric substrate comprises a honeycomb substrate.

10. The graphene-coated substrate according to claim 9, wherein the honeycomb substrate comprises a cordierite honeycomb substrate.

11. A graphene-coated substrate, comprising:
a dielectric substrate; and
a graphene layer formed in direct contact with a surface of the substrate, wherein:
the substrate comprises a glass, ceramic or glass-ceramic;
the graphene layer comprises a sheet resistance of about 100 kΩ/sqr or less;
the graphene layer comprises a transmissivity at 550 nm of about 70% or more; and
the total concentration of water and hydroxyl groups at a graphene-substrate interface is less than 0.5 at. %.

12. The graphene-coated substrate according to claim 11, wherein the graphene layer comprises a sheet resistance of about 50 kΩ/sqr or less.

13. The graphene-coated substrate according to claim 11, wherein the graphene layer comprises a sheet resistance of about 10 kΩ/sqr or less.

14. The graphene-coated substrate according to claim 11, wherein the graphene layer comprises a transmissivity at 550 nm of about 80% or more.

15. The graphene-coated substrate according to claim 11, wherein:
   the substrate surface is free of a metal catalyst; and
   the graphene layer is free of a metal catalyst.

16. The graphene-coated substrate according to claim 11, wherein the graphene layer thickness is from 0.34 to 100 nm.

17. The graphene-coated substrate according to claim 11, wherein the graphene layer comprises a bi-layer graphene layer having two atomic layers of carbon.

18. The graphene-coated substrate according to claim 11, wherein the graphene layer comprises a tri-layer graphene layer having three atomic layers of carbon.

19. The graphene-coated substrate according to claim 11, wherein the graphene layer comprises N atomic layers of carbon, where $4 \leq N \leq 100$.

* * * * *

UNITED STATES PATENT AND TRADEMARK OFFICE
CERTIFICATE OF CORRECTION

PATENT NO. : 9,970,101 B2
APPLICATION NO. : 15/332562
DATED : May 15, 2018
INVENTOR(S) : Xinyuan Liu et al.

Page 1 of 1

It is certified that error appears in the above-identified patent and that said Letters Patent is hereby corrected as shown below:

On the Title Page

On page 2, Column 2, item (56), foreign patent documents, Line 4, delete "20130049048 a" and insert -- 20130049048 A --, therefor.

On page 2, Column 2, item (56), other publications, Line 15, delete "20 11," and insert -- 2011, --, therefor.

On page 2, Column 2, item (56), other publications, Line 17, delete "sapohire" and insert -- sapphire --, therefor.

Signed and Sealed this
Fourteenth Day of April, 2020

Andrei Iancu
*Director of the United States Patent and Trademark Office*